United States Patent
Chen et al.

(10) Patent No.: US 10,176,741 B2
(45) Date of Patent: Jan. 8, 2019

(54) GATE DRIVING UNIT, GATE DRIVING CIRCUIT AND DRIVING METHOD THEREOF AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Mo Chen, Beijing (CN); Jinliang Liu, Beijing (CN); Yang Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/578,679

(22) PCT Filed: Apr. 26, 2017

(86) PCT No.: PCT/CN2017/081967
§ 371 (c)(1),
(2) Date: Nov. 30, 2017

(87) PCT Pub. No.: WO2018/082276
PCT Pub. Date: May 11, 2018

(65) Prior Publication Data
US 2018/0308408 A1    Oct. 25, 2018

(51) Int. Cl.
*G09G 3/20* (2006.01)

(52) U.S. Cl.
CPC ....... *G09G 3/20* (2013.01); *G09G 2310/0283* (2013.01); *G09G 2310/061* (2013.01); *G09G 2310/08* (2013.01); *G09G 2330/021* (2013.01)

(58) Field of Classification Search
CPC ............ G09G 3/20; G09G 2310/0283; G09G 2310/061; G09G 2310/08; G09G 2330/021
See application file for complete search history.

(56) References Cited

U.S. PATENT DOCUMENTS

| 2012/0188210 A1* | 7/2012 | Zhang | G09G 3/3677 345/204 |
|---|---|---|---|
| 2014/0160000 A1 | 6/2014 | Ma et al. | |

(Continued)

FOREIGN PATENT DOCUMENTS

| CN | 103021358 A | 4/2013 |
|---|---|---|
| CN | 103065592 A | 4/2013 |

(Continued)

OTHER PUBLICATIONS

International Search Report and Written Opinion in PCT/CN2017/081967 dated Jul. 28, 2017, with English translation.

*Primary Examiner* — Ryan A Lubit
(74) *Attorney, Agent, or Firm* — Womble Bond Dickinson (US) LLP

(57) ABSTRACT

This disclosure provides a gate driving unit, comprising an input sub-circuit, a pull-up sub-circuit, a transmission sub-circuit, an output sub-circuit, a reset sub-circuit, a pull-down sub-circuit and a storage sub-circuit, an input signal input terminal, a first clock signal input terminal, a second clock signal input terminal, a third clock signal input terminal, a fourth clock signal input terminal, a reset signal input terminal, a first level input terminal, a second level input terminal and a gate driving signal output terminal. This disclosure further provides a gate driving circuit and a driving method thereof, as well as a display device.

20 Claims, 4 Drawing Sheets

(56) References Cited

U.S. PATENT DOCUMENTS

| | | | |
|---|---|---|---|
| 2015/0206490 A1* | 7/2015 | Lim | G09G 3/3677 345/92 |
| 2016/0182042 A1* | 6/2016 | Kim | G09G 3/3225 345/213 |
| 2017/0025079 A1 | 1/2017 | Feng et al. | |

FOREIGN PATENT DOCUMENTS

| | | |
|---|---|---|
| CN | 103065593 A | 4/2013 |
| CN | 104952417 A | 9/2015 |
| CN | 105810170 A | 7/2016 |
| CN | 106448538 A | 2/2017 |

* cited by examiner

GATE DRIVING UNIT, GATE DRIVING CIRCUIT AND DRIVING METHOD THEREOF AND DISPLAY DEVICE

RELATED APPLICATION

The present application is the U.S. national phase entry of PCT/CN2017/081967, with an international filing date of Apr. 26, 2017, which claims the priority of the Chinese patent application No. 201610936448.3 filed on Nov. 1, 2016, the entire disclosure of which is incorporated herein by reference.

FIELD

This disclosure relates to the field of display technology, particularly, to a gate driving unit, a gate driving circuit comprising the gate driving unit, a display device comprising the gate driving circuit, and a driving method of the gate driving circuit.

BACKGROUND

At present, a display device is generally constituted by vertical and horizontal array pixel matrixes. In a display process of the display device, a gate scanning signal is outputted from a gate driving circuit, thereby scanning and accessing individual pixels row by row, and realizing display in cooperation with image data.

In the display device, the gate driving circuit is used for generating a gate scanning signal for each pixel. Each stage of gate driving unit in the gate driving circuit serves as a shift register to transmit the scanning signal to a next stage of gate driving unit successively, thereby turning on a thin film transistor (TFT) switch of the pixel row by row, so as to achieve data signal input to the pixel. A bi-directional scanning circuit, as a special gate driving circuit, can control forward or backward scanning of the gate scanning signal only by changing timing of the input signal without changing a physical structure of the gate driving unit.

A clock signal is an external input signal for driving the gate driving unit to operate, which is generally a periodic, positive and negative alternating voltage signal. In order to ensure that individual pixels in the gate driving circuit can be turned on normally, an effective level of the clock signal generally needs a voltage with a higher absolute value. As such, higher power consumption will be generated in the process of positive and negative alternation of the clock signal.

Therefore, how to reduce the power consumption of the clock signal of the gate driving circuit while ensuring normal work of pixels of a display device is a problem to be urgently solved by the skilled person in the art.

SUMMARY

An object of this disclosure is to provide a gate driving unit, a gate driving circuit comprising the gate driving unit, a display device comprising the gate driving circuit, and a driving method of the gate driving circuit, which can at least partly mitigate or eliminate one or more of the problems in the prior art mentioned above.

According to an aspect of this disclosure, a gate driving unit is provided. The gate driving unit comprises an input sub-circuit, a pull-up sub-circuit, a transmission sub-circuit, an output sub-circuit, a reset sub-circuit, a pull-down sub-circuit and a storage sub-circuit. The gate driving unit further comprises an input signal input terminal, a first clock signal input terminal, a second clock signal input terminal, a third clock signal input terminal, a fourth clock signal input terminal, a reset signal input terminal, a first level input terminal, a second level input terminal and a gate driving signal output terminal. The input sub-circuit is coupled to the input signal input terminal, the first clock signal input terminal and a pull-up node, and is configured to input an input signal to the pull-up node under control of a first clock signal. The pull-up sub-circuit is coupled to the second clock signal input terminal, the pull-up node and a pull-down node, and is configured to pull up the pull-down node to a third level and pull up a level of the pull-up node through the storage sub-circuit. The transmission sub-circuit is coupled to the second clock signal input terminal, the pull-up node and a transmission node, and is configured to transmit the level of the pull-up node to the transmission node under control of a second clock signal. The output sub-circuit is coupled to the transmission node, the first level input terminal and the gate driving signal output terminal, and is configured to output a gate driving signal. The reset sub-circuit is coupled to the reset signal input terminal, the first clock signal input terminal, the gate driving signal output terminal and the second level input terminal, and is configured to reset the gate driving signal output terminal under control of a reset signal. The pull-down sub-circuit is coupled to the pull-up node, the pull-down node, the transmission node, the second level input terminal, the third clock signal input terminal and the fourth clock signal input terminal, and is configured to pull down the pull-up node, the pull-down node and the transmission node to a second level under control of a third clock signal and a fourth clock signal. The storage sub-circuit is coupled to the pull-up node and the pull-down node, and is configured to store the input signal. Particularly, the third level is an effective level of the first clock signal, the second clock signal, the third clock signal and the fourth clock signal, and an absolute value of the third level is less than an absolute value of the first level.

As used in this text, the "effective level" of a signal refers to a level that enables the sub-circuit controlled by the signal to take a corresponding action. For example, the effective level of the first clock signal enables the input sub-circuit to input the input signal to the pull-up node, and the effective level of the second clock signal enables the transmission sub-circuit to transmit the level of the pull-up node to the transmission node.

In some embodiments, the pull-down sub-circuit comprises a first pull-down sub-circuit unit, a second pull-down sub-circuit unit and a third pull-down sub-circuit unit. The first pull-down sub-circuit unit is coupled to the pull-up node, the second level input terminal and the fourth clock signal input terminal, and is configured to pull down the pull-up node to the second level under control of the fourth clock signal. The second pull-down sub-circuit unit is coupled to the third clock signal input terminal, the second level input terminal and the pull-down node, and is configured to pull down the pull-down node to the second level under control of the third clock signal. The third pull-down sub-circuit unit is coupled to the third clock signal input terminal, the transmission node and the second level input terminal, and is configured to pull down the transmission node to the second level under control of the third clock signal.

In some embodiments, the pull-down sub-circuit comprises a first pull-down sub-circuit unit and a second pull-down sub-circuit unit. The first pull-down sub-circuit unit is coupled to the pull-up node, the second level input terminal and the fourth clock signal input terminal, and is configured to pull down the pull-up node to the second level under control of the fourth clock signal. The second pull-down sub-circuit unit is coupled to the third clock signal input terminal, the second level input terminal, the pull-down node and the transmission node, and is configured to pull down the pull-down node and the transmission node to the second level under control of the third clock signal.

In some embodiments, the input sub-circuit comprises a first transistor, a control terminal of the first transistor is coupled to the first clock signal input terminal, a first terminal of the first transistor is coupled to the input signal input terminal, and a second terminal of the first transistor is coupled to the pull-up node.

In some embodiments, the first pull-down sub-circuit unit comprises a second transistor, a control terminal of the second transistor is coupled to the fourth clock signal input terminal, a first terminal of the second transistor is coupled to the second level input terminal, and a second terminal of the second transistor is coupled to the pull-up node.

In some embodiments, the second pull-down sub-circuit unit comprises a third transistor, a control terminal of the third transistor is coupled to the third clock signal input terminal, a first terminal of the third transistor is coupled to the second level input terminal, and a second terminal of the third transistor is coupled to the pull-down node.

In some embodiments, the third pull-down sub-circuit unit comprises a fourth transistor, a control terminal of the four transistor is coupled to the third clock signal input terminal, a first terminal of the four transistor is coupled to the second level input terminal, and a second terminal of the four transistor is coupled to the transmission node.

In some embodiments, the pull-up sub-circuit comprises a fifth transistor, a control terminal of the fifth transistor is coupled to the pull-up node, a first terminal of the fifth transistor is coupled to the second clock signal input terminal, and a second terminal of the fifth transistor is coupled to the pull-down node.

In some embodiments, the transmission sub-circuit comprises a sixth transistor, a control terminal of the sixth transistor is coupled to the second clock signal input terminal, a first terminal of the sixth transistor is coupled to the pull-up node, and a second terminal of the sixth transistor is coupled to the transmission node.

In some embodiments, the output sub-circuit comprises a seventh transistor, a control terminal of the seventh transistor is coupled to the transmission node, a first terminal of the seventh transistor is coupled to the first level input terminal, and a second terminal of the seventh transistor is coupled to the gate driving signal output terminal.

In some embodiments, the reset sub-circuit comprises an eighth transistor and a ninth transistor, a control terminal of the eighth transistor is coupled to the reset signal input terminal, a first terminal of the eighth transistor is coupled to the second level input terminal, and a second terminal of the eighth transistor is coupled to the gate driving signal output terminal. A control terminal of the ninth transistor is coupled to the first clock signal input terminal, a first terminal of the ninth transistor is coupled to the second level input terminal, and a second terminal of the ninth transistor is coupled to the gate driving signal output terminal.

In some embodiments, the storage sub-circuit comprises a capacitor, a first plate of the capacitor is coupled to the pull-up node, and a second plate of the capacitor is coupled to the pull-down node.

In some embodiments, the first to the ninth transistors are N-type transistors, the first terminal is a drain, the second terminal is a source, the first level input terminal is a high level input terminal, and the second level input terminal is a low level input terminal.

According to another aspect of this disclosure, a gate driving circuit is provided. The gate driving circuit comprises a plurality of cascaded gate driving units stated in any of the above, as well as a signal input terminal and a signal reset terminal. In the gate driving circuit, except for a first stage and a last stage of gate driving units, a gate driving signal output terminal of each stage of gate driving unit is coupled to a reset signal input terminal of a previous stage of gate driving unit and an input signal input terminal of a next stage of gate driving unit. The input signal input terminal of the first stage of gate driving unit is coupled to the signal input terminal of the gate driving circuit, and the reset signal input terminal of the last stage of gate driving unit is coupled to the signal reset terminal of the gate driving circuit.

In some embodiments, the gate driving circuit is coupled with a first clock signal line, a second clock signal line, a third clock signal line and a fourth clock signal line. A first clock signal input terminal of the 4n-th stage of gate driving unit is coupled to the first clock signal line, a second clock signal input terminal of the 4n-th stage of gate driving unit is coupled to the second clock signal line, a third clock signal input terminal of the 4n-th stage of gate driving unit is coupled to the third clock signal line, and a fourth clock signal input terminal of the 4n-th stage of gate driving unit is coupled to the fourth clock signal line. A first clock signal input terminal of the 4n+1-th stage of gate driving unit is coupled to the second clock signal line, a second clock signal input terminal of the 4n+1-th stage of gate driving unit is coupled to the third clock signal line, a third clock signal input terminal of the 4n+1-th stage of gate driving unit is coupled to the fourth clock signal line, and a fourth clock signal input terminal of the 4n+1-th stage of gate driving unit is coupled to the first clock signal line. A first clock signal input terminal of the 4n+2-th stage of gate driving unit is coupled to the third clock signal line, a second clock signal input terminal of the 4n+2-th stage of gate driving unit is coupled to the fourth clock signal line, a third clock signal input terminal of the 4n+2-th stage of gate driving unit is coupled to the first clock signal line, and a fourth clock signal input terminal of the 4n+2-th stage of gate driving unit is coupled to the second clock signal line. A first clock signal input terminal of the 4n+3-th stage of gate driving unit is coupled to the fourth clock signal line, a second clock signal input terminal of the 4n+3-th stage of gate driving unit is coupled to the first clock signal line, a third clock signal input terminal of the 4n+3-th stage of gate driving unit is coupled to the second clock signal line, and a fourth clock signal input terminal of the 4n+3-th stage of gate driving unit is coupled to the third clock signal line. Particularly, n is an integer no smaller than 0.

According to a further aspect of this disclosure, a display device is provided, comprising the gate driving circuit stated in any of the above.

An additional aspect of this disclosure further provides a driving method of the gate driving circuit stated in any of the above. In the method, a process of driving an Nth stage of gate driving unit comprises: an input charging phase, an output phase, a reset phase and a discharging phase. In the input charging phase, under control of a first clock signal, an input sub-circuit pulls up a pull-up node to a first level, and a storage sub-circuit is charged so as to store the first level of the pull-up node. In the output phase, under control of a second clock signal, a pull-up sub-circuit further pulls up a first node, and a transmission sub-circuit transmits the level of the pull-up node to a transmission node, and under control of the level, an output sub-circuit outputs a Nth stage of gate driving signal. In the reset phase, a pull-down sub-circuit pulls down a pull-down node and the transmission node to a second level under control of a third clock signal, and pulls down the pull-up node to the first level, and the reset sub-circuit resets the gate driving signal output terminal under control of a reset signal. In the discharging phase, under control of a fourth clock signal, the storage sub-circuit discharges, and the pull-down sub-circuit pulls down the pull-up node to the second level. N is an integer no smaller than 1.

In some embodiments, the pull-up node, the pull-down node and the transmission node of the Nth stage of gate driving unit are maintained at the second level through the pull-down sub-circuit of the Nth stage of gate driving unit under control of the third clock signal and the fourth clock signal when the gate driving units except for the Nth stage of gate driving unit are driven.

In some embodiments, effective level time of each of the first clock signal, the second clock signal, the third clock signal and the fourth clock signal is ¼ cycle. That is, the first clock signal, the second clock signal, the third clock signal and the fourth clock signal have equal effective level time, which constitute a complete clock cycle of the gate driving circuit together.

In some embodiments, the first clock signal, the second clock signal, the third clock signal and the fourth clock signal use forward driving mode or reverse driving mode. In the forward driving mode, the first clock signal, the second clock signal, the third clock signal and the fourth clock signal are set at the effective level in sequence, and are delayed by ¼ cycle in sequence respectively. In the reverse driving mode, the fourth clock signal, the third clock signal, the second clock signal and the first clock signal are set at the effective level in sequence, and are delayed by ¼ cycle in sequence respectively. The fourth clock signal in the reverse driving mode is ¼ cycle ahead of the first clock signal in the forward driving mode.

It should be pointed out that the aspects of this disclosure have similar or same example implementations and benefits, which will not be repeated here.

These and other aspects of this disclosure will be obvious from the embodiment described below and will be set forth with reference to the embodiments described below.

DETAILED DESCRIPTION

Figure 1:
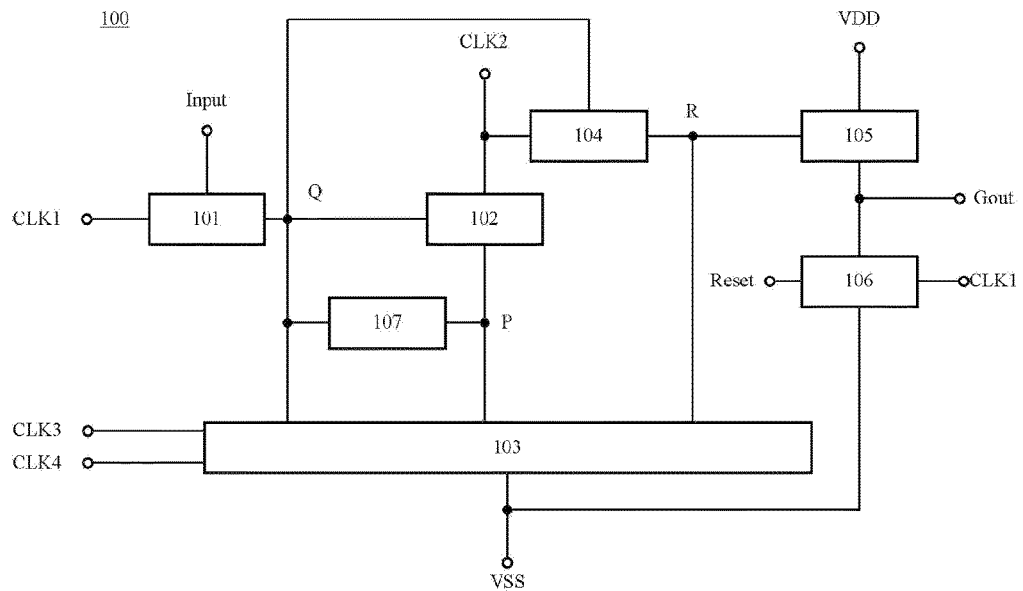
FIG. 1 schematically illustrates a structural block diagram of a gate driving unit according to an embodiment of this disclosure.

Next, exemplary embodiments of this disclosure will be described in detail in conjunction with the drawings. The drawings are schematic and are not drawn to scale, moreover, they are only for explaining the embodiments of this disclosure rather than intending to limit the protection scope of this disclosure. In the drawings, the same reference sign represents the same or similar parts. In order to enable the technical solution of this disclosure to be clearer, the process steps and device structures that have been well known in the art are omitted here.

FIG. 1 schematically illustrates a structural block diagram of a gate driving unit 100 according to an embodiment of this disclosure. As shown in FIG. 1, the gate driving unit 100 comprises an input sub-circuit 101, a pull-up sub-circuit 102, a pull-down sub-circuit 103, a transmission sub-circuit 104, an output sub-circuit 105, a reset sub-circuit 106 and a storage sub-circuit 107. The gate driving unit 100 further comprises signal input terminals and signal output terminals for inputting and outputting various signals. Specifically, the gate driving unit 100 comprises an input signal input terminal Input, a first clock signal input terminal CLK1, a second clock signal input terminal CLK2, a third clock signal input terminal CLK3, a fourth clock signal input terminal CLK4, a reset signal input terminal Reset, a first level input terminal VDD, a second level input terminal VSS and a gate driving signal output terminal Gout.

As shown in FIG. 1, the input sub-circuit 101 is coupled to the input signal input terminal Input, the first clock signal input terminal CLK1 and the pull-up node Q, and configured to input an input signal inputted through the input signal input terminal Input to the pull-up node Q under control of a first clock signal inputted through the first clock signal input terminal CLK1.

The pull-up sub-circuit 102 is coupled to the second clock signal input terminal CLK2, the pull-up node Q and the pull-down node P, and configured to pull up the pull-down node P to a third level and pull up the level of the pull-up node Q through the storage sub-circuit 107.

The transmission sub-circuit 104 is coupled to the second clock signal input terminal CLK2, the pull-up node Q and the transmission node R, and configured to transmit the level of the pull-up node Q to the transmission node R under control of a second clock signal inputted through the second clock signal input terminal CLK2.

The output sub-circuit 105 is coupled to the transmission node R, the first level input terminal VDD and the gate driving signal output terminal Gout, and configured to output a gate driving signal.

The reset sub-circuit 106 is coupled to the reset signal input terminal Reset, the first clock signal input terminal CLK1, the gate driving signal output terminal Gout and the second level input terminal VSS, and configured to reset the gate driving signal output terminal Gout under control of a reset signal inputted through the reset signal input terminal Reset.

The pull-down sub-circuit 103 is coupled to the pull-up node Q, the pull-down node P, the transmission node R, the second level input terminal VSS, the third clock signal input terminal CLK3 and the fourth clock signal input terminal CLK4, and configured to pull down the pull-up node Q, the pull-down node P and the transmission node R to a second level under control of a third clock signal and a fourth clock signal inputted through the third clock signal input terminal CLK3 and the fourth clock signal input terminal CLK4 respectively.

The storage sub-circuit 107 is coupled to the pull-up node Q and the pull-down node P, and configured to store the input signal inputted through the input signal input terminal Input.

In the gate driving unit 100, the third level is the effective level of the first clock signal, the second clock signal, the third clock signal and the fourth clock signal inputted through the first clock signal input terminal CLK1, the second clock signal input terminal CLK2, the third clock signal input terminal CLK3 and the fourth clock signal input terminal CLK4 respectively, and the absolute value of the third level is less than the absolute value of the first level inputted through the first level input terminal VDD.

As indicated above, the "effective level" of a signal refers to a level that enables the sub-circuit controlled by the signal to take a corresponding action. For example, the effective level of the first clock signal CLK1 enables the input sub-circuit 101 to input the input signal to the pull-up node Q, and the effective level of the second clock signal CLK2 enables the transmission sub-circuit 104 to transmit the level of the pull-up node Q to the transmission node R.

In the above gate driving unit provided by this disclosure, an extra DC level signal is used to drive the gate scanning signal, so as to enable the effective level of the clock signal to be at a lower voltage level, while ensuring normal operation of the pixels of the display device, thereby achieving the aim of reducing the power consumption.

Figure 2:
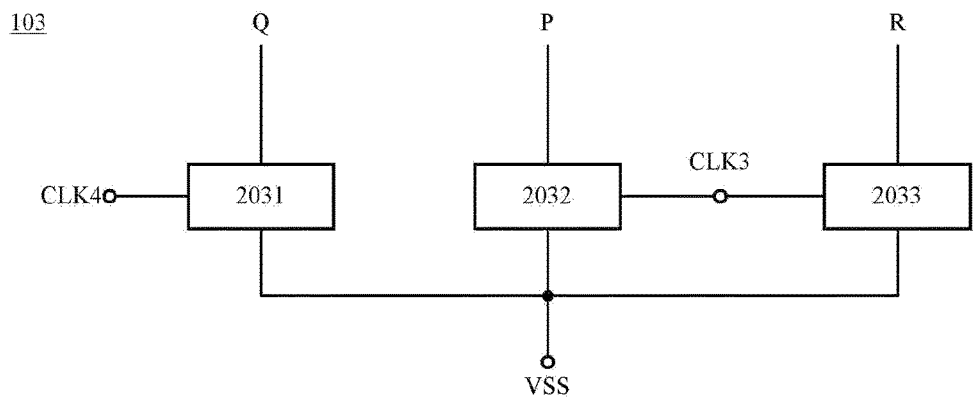
FIG. 2 schematically illustrates a structural block diagram of a pull-down sub-circuit according to an embodiment of this disclosure.

FIG. 2 schematically illustrates a structural block diagram of a pull-down sub-circuit according to an embodiment of this disclosure. The pull-down sub-circuit 103 comprises a first pull-down sub-circuit unit 2031, a second pull-down sub-circuit unit 2032 and a third pull-down sub-circuit unit 2033.

As shown in FIG. 2, the first pull-down sub-circuit unit 2031 is coupled to the pull-up node Q, the second level input terminal VSS and the fourth clock signal input terminal CLK4, and is configured to pull down the pull-up node Q to the second level inputted through the second level input terminal VSS under control of the fourth clock signal inputted through the fourth clock signal input terminal CLK4.

The second pull-down sub-circuit unit 2032 is coupled to the third clock signal input terminal CLK3, the second level input terminal VSS and the pull-down node P, and is configured to pull down the pull-down node P to the second level inputted through the second level input terminal VSS under the control of the third clock signal inputted through the third clock signal input terminal CLK3.

The third pull-down sub-circuit unit 2033 is coupled to the third clock signal input terminal CLK3, the transmission node R and the second level input terminal VSS, and is configured to pull down the transmission node R to the second level inputted through the second level input terminal VSS under the control of the third clock signal inputted through the third clock signal input terminal CLK3.

Figure 3:
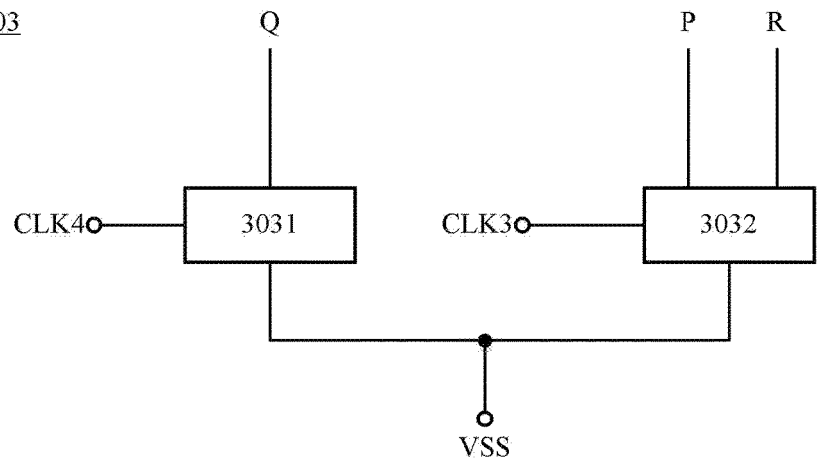
FIG. 3 schematically illustrates another structural block diagram of the pull-down sub-circuit according to an embodiment of this disclosure.

Alternatively, as shown in FIG. 3, the pull-down sub-circuit 103 comprises a first pull-down sub-circuit unit 3031 and a second pull-down sub-circuit unit 3032. The first pull-down sub-circuit unit 3031, similar as the first pull-down sub-circuit unit 2031 in FIG. 2, is coupled to the pull-up node Q, the second level input terminal VSS and the fourth clock signal input terminal CLK4, and is configured to pull down the pull-up node Q to the second level inputted through the second level input terminal VSS under control of the fourth clock signal inputted through the fourth clock signal input terminal CLK4.

The second pull-down sub-circuit unit 3032 is coupled to the third clock signal input terminal CLK3, the second level input terminal VSS, the pull-down node P and the transmission node R, and is configured to pull down the pull-down node P and the transmission node R to the second level inputted through the second level input terminal VSS under the control of the third clock signal inputted through the third clock signal input terminal CLK3.

Figure 4:
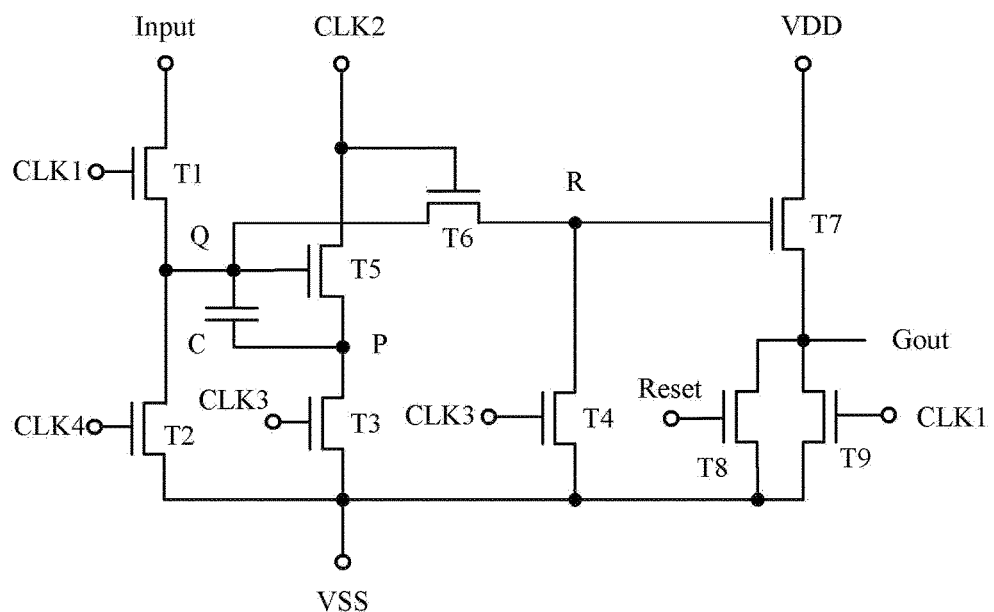
FIG. 4 schematically illustrates a circuit diagram of a gate driving unit according to an embodiment of this disclosure.

FIG. 4 schematically illustrates a circuit diagram of a gate driving unit according to an embodiment of this disclosure. As shown in FIG. 4, the input sub-circuit comprises a first transistor T1. A control terminal of the first transistor T1 is coupled to the first clock signal input terminal CLK1, a first terminal of the first transistor T1 is coupled to the input signal input terminal Input, and a second terminal of the first transistor T1 is coupled to the pull-up node Q.

The pull-down sub-circuit comprises a second transistor T2, a third transistor T3 and a fourth transistor T4. A control terminal of the second transistor T2 is coupled to the fourth clock signal input terminal CLK4, a first terminal of the second transistor T2 is coupled to the second level input terminal VSS, and a second terminal of the second transistor T2 is coupled to the pull-up node Q. A control terminal of the third transistor T3 is coupled to the third clock signal input terminal CLK3, a first terminal of the third transistor T3 is coupled to the second level input terminal VSS, and a second terminal of the third transistor T3 is coupled to the pull-down node P. A control terminal of the fourth transistor T4 is coupled to the third clock signal input terminal CLK3, a first terminal of the fourth transistor T4 is coupled to the second level input terminal VSS, and a second terminal of the fourth transistor T4 is coupled to the transmission node R.

The pull-up sub-circuit comprises a fifth transistor T5. A control terminal of the fifth transistor T5 is coupled to the pull-up node Q, a first terminal of the fifth transistor T5 is coupled to the second clock signal input terminal CLK2, and a second terminal of the fifth transistor T5 is coupled to the pull-down node P.

The transmission sub-circuit comprises a sixth transistor T6. A control terminal of the sixth transistor T6 is coupled to the second clock signal input terminal CLK2, a first terminal of the sixth transistor T6 is coupled to the pull-up node Q, and a second terminal of the sixth transistor T6 is coupled to the transmission node R.

The output sub-circuit comprises a seventh transistor T7. A control terminal of the seventh transistor T7 is coupled to the transmission node R, a first terminal of the seventh transistor T7 is coupled to the first level input terminal VDD, and a second terminal of the seventh transistor T7 is coupled to the gate driving signal output terminal Gout.

The reset sub-circuit comprises an eighth transistor T8 and a ninth transistor T9. A control terminal of the eighth transistor T8 is coupled to the reset signal input terminal Reset, a first terminal of the eighth transistor T8 is coupled to the second level input terminal VSS, and a second terminal of the eighth transistor T8 is coupled to the gate driving signal output terminal Gout. A control terminal of the ninth transistor T9 is coupled to the first clock signal input terminal CLK1, a first terminal of the ninth transistor T9 is coupled to the second level input terminal VSS, and a second terminal of the ninth transistor T9 is coupled to the gate driving signal output terminal Gout.

The storage sub-circuit comprises a capacitor C. A first plate of the capacitor C is coupled to the pull-up node Q, and a second plate of the capacitor C is coupled to the pull-down node P.

The first to the ninth transistors can select transistors of any known type of the art. For example, as shown in FIG. 4, the first to the ninth transistors T1-T9 are all N-type transistors. In such a case, the first terminal of the transistor is a drain, and the second terminal of the transistor is a source. Correspondingly, the first level input terminal VDD is a high level input terminal, the second level input terminal VSS is a low level input terminal, the third level is a high level, and the third level is less than the level inputted through the first level input terminal VDD.

Figure 5:
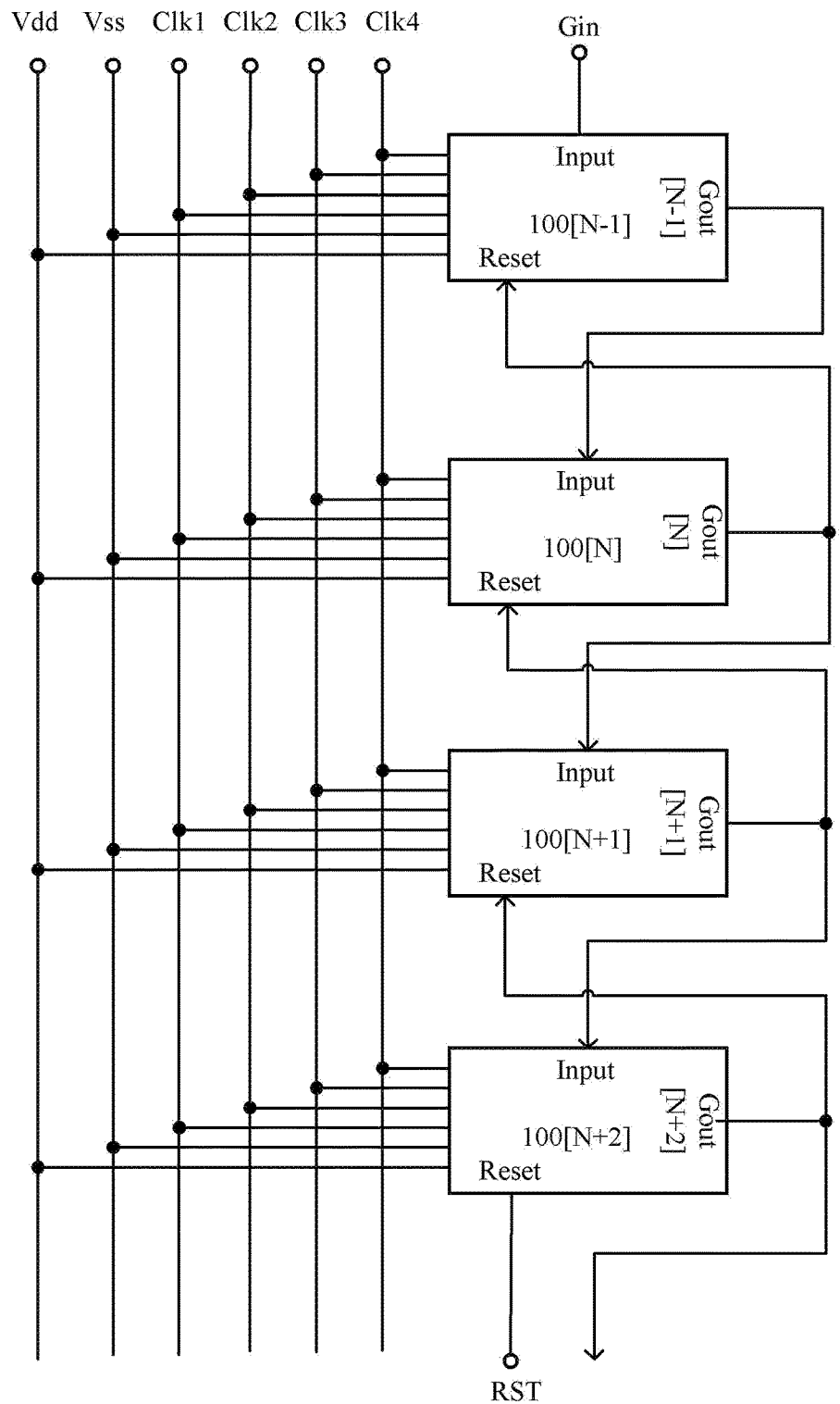
FIG. 5 schematically illustrates a structural diagram of a gate driving circuit according to an embodiment of this disclosure.

FIG. 5 schematically illustrates a structural diagram of a gate driving circuit according to an embodiment of this disclosure. As shown in FIG. 5, the gate driving circuit comprises a plurality of cascaded gate driving units 100 stated in any of the above, as well as a signal input terminal Gin and a signal reset terminal RST. In the gate driving circuit, except for a first stage and a last stage of gate driving units, a gate driving signal output terminal Gout[N] of each stage of gate driving unit 100[N] is coupled to a reset signal input terminal Reset[N−1] of a previous stage of gate driving unit 100[N−1] and an input signal input terminal Input[N+1] of a next stage of gate driving unit 100[N+1]. The input signal input terminal of the first stage of gate driving unit is coupled to the signal input terminal Gin of the gate driving circuit, and the reset signal input terminal of the last stage of gate driving unit is coupled to the signal reset terminal RST of the gate driving circuit. The first level input terminal and the second level input terminal of each stage of gate driving unit are coupled to the first level line Vdd and the second level line Vss respectively.

In order to generate a gate scanning signal for each pixel corresponding to each stage of gate driving unit, the gate driving circuit is coupled with a first clock signal line Clk1, a second clock signal line Clk2, a third clock signal line Clk3 and a fourth clock signal line Clk4. A first clock signal input terminal CLK1[4n] of the 4n-th stage of gate driving unit is coupled to the first clock signal line Clk1, a second clock signal input terminal CLK2[4n] of the 4n-th stage of gate driving unit is coupled to the second clock signal line Clk2, a third clock signal input terminal CLK3[4n] of the 4n-th stage of gate driving unit is coupled to the third clock signal line Clk3, and a fourth clock signal input terminal CLK4[4n] of the 4n-th stage of gate driving unit is coupled to the fourth clock signal line Clk4. A first clock signal input terminal CLK1[4n+1] of the 4n+1-th stage of gate driving unit is coupled to the second clock signal line Clk2, a second clock signal input terminal CLK2[4n+1] of the 4n+1-th stage of gate driving unit is coupled to the third clock signal line Clk3, a third clock signal input terminal CLK3[4n+1] of the 4n+1-th stage of gate driving unit is coupled to the fourth clock signal line Clk4, and a fourth clock signal input terminal CLK4[4n+1] of the 4n+1-th stage of gate driving unit is coupled to the first clock signal line Clk1. A first clock signal input terminal CLK1[4n+2] of the 4n+2-th stage of gate driving unit is coupled to the third clock signal line Clk3, a second clock signal input terminal CLK2[4n+2] of the 4n+2-th stage of gate driving unit is coupled to the fourth clock signal line Clk4, a third clock signal input terminal CLK3[4n+2] of the 4n+2-th stage of gate driving unit is coupled to the first clock signal line Clk1, and a fourth clock signal input terminal CLK4[4n+2] of the 4n+2-th stage of gate driving unit is coupled to the second clock signal line Clk2. A first clock signal input terminal CLK1[4n+3] of the 4n+3-th stage of gate driving unit is coupled to the fourth clock signal line Clk4, a second clock signal input terminal CLK2[4n+3] of the 4n+3-th stage of gate driving unit is coupled to the first clock signal line Clk1, a third clock signal input terminal CLK3[4n+3] of the 4n+3-th stage of gate driving unit is coupled to the second clock signal line Clk2, and a fourth clock signal input terminal CLK4[4n+3] of the 4n+3-th stage of gate driving unit is coupled to the third clock signal line Clk3. n is an integer no smaller than 0. That is, here the first stage of gate driving unit can also be called the $0^{th}$ stage of gate driving unit.

In the above gate driving circuit, since the input signal of each stage of gate driving unit except for the first stage of gate driving unit comes from the gate driving signal output of the previous stage of gate driving unit, and the effective level of the clock signal needs to be synchronous with the input signal, hence, the clock signal lines to which the clock signal input terminals of every four adjacent gate driving units correspond are postponed and sequentially changed, thereby generating a gate scanning signal for each pixel.

Figure 6:
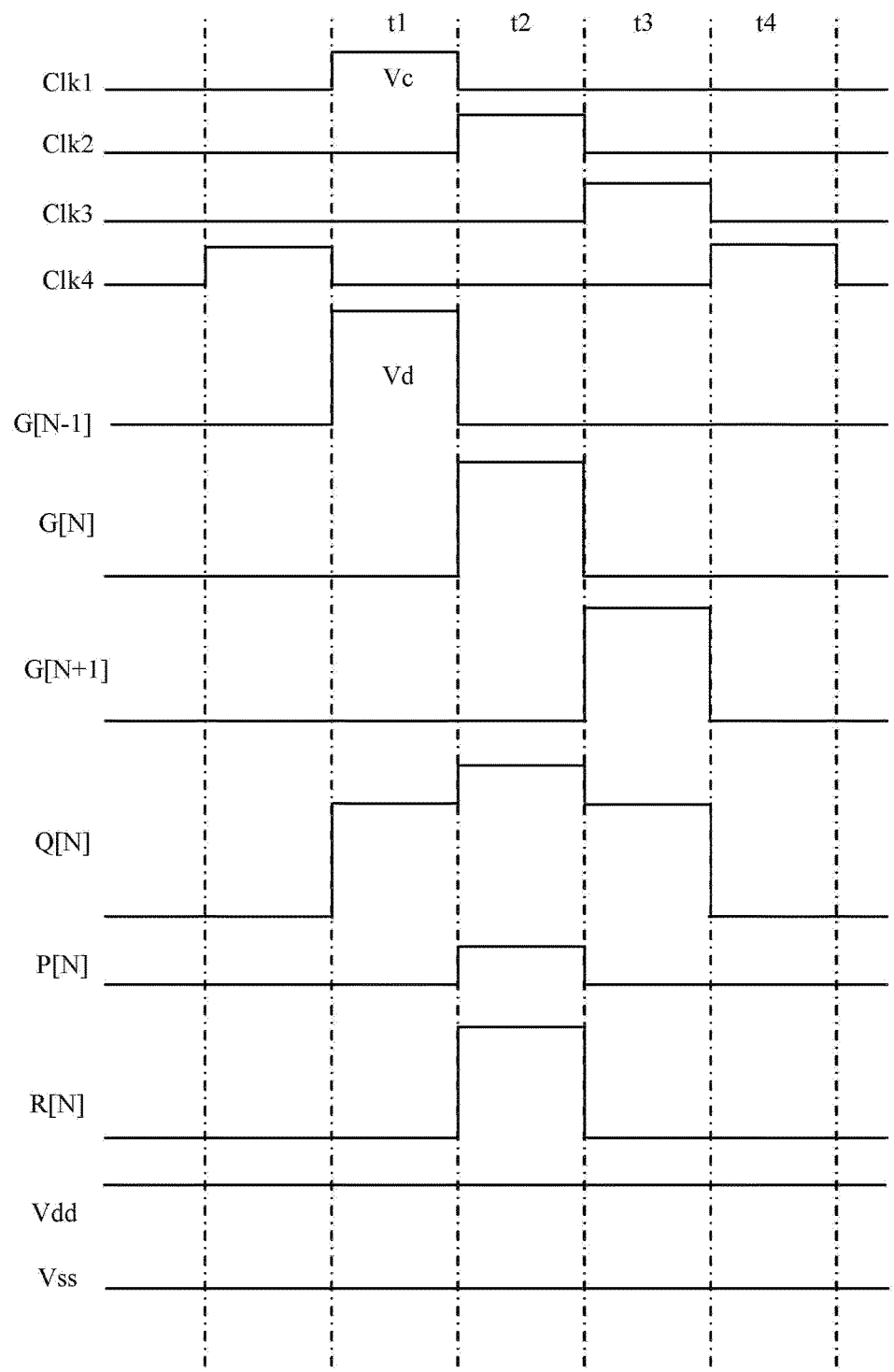
FIG. 6 schematically illustrates a working timing diagram of the gate driving circuit as shown in FIG. 5.

Next, the working process of the gate driving circuit provided by an embodiment of this disclosure will be described in detail in conjunction with the circuit diagram as shown in FIG. 4 and FIG. 6 which schematically illustrates the working timing of the gate driving circuit as shown in FIG. 5. It is to be noted that in FIG. 4, the first to the ninth transistors T1-T9 are all N-type transistors, and the first level input terminal VDD is a high level input terminal, the second level input terminal VSS is a low level input terminal. The third level is a high level Vc, and the third level Vc is less than the level Vd inputted through the first level input terminal VDD.

As shown in FIG. 6 the process of driving the Nth stage of gate driving unit comprises an input charging phase, an output phase, a reset phase and a discharging phase.

In the input charging phase t1, the first clock signal input terminal CLK1 inputs the effective level Vc, so as to turn on the first transistor T1, hence, the pull-up node Q[N] is pulled up to the first level Vd of output G[N−1] of the previous stage of gate driving unit inputted from the signal input terminal Input. Meanwhile, the capacitor C is charged, so as to store the first level Vd in the capacitor C. Since the pull-up node Q[N] is at the first level Vd, and the second clock signal input terminal CLK2 is at a low level, hence, the fifth transistor T5 is turned on, and the pull-down node P[N] is pulled down to the low level. In addition, since the ninth transistor T9 is turned on, the gate signal output terminal of the gate driving unit is pulled down to the low level, i.e., the gate driving unit does not output an effective gate driving signal.

In the output phase t2, the second clock signal input terminal CLK2 inputs the effective level Vc. Since the fifth transistor T5 remains turned on, the pull-down node P[N] is pulled up to the high level Vc. Since the capacitor C needs to keep the voltage difference between two plates unchanged (i.e., the bootstrap function of the capacitor), the level of the pull-up node Q[N] is further pulled up to (Vd+Vc). Meanwhile, the sixth transistor T6 is turned on, thereby transmitting the high level (Vd+Vc) of the pull-up node Q[N] to the transmission node R[N]. At that time, the gate voltage of the seventh transistor T7 is (Vd+Vc), thereby ensuring that the seventh transistor T7 as the driving transistor can be turned on sufficiently, so as to enable the gate driving unit to output a gate driving signal Gout[N]. Meanwhile, the high level Vd of the gate driving signal Gout[N] can also meet the requirement of enabling the thin film transistor in the pixel to be turned on.

In the reset phase t3, the third clock signal input terminal CLK3 inputs the effective level Vc, so as to turn on the third transistor T3 and the fourth transistor T4, thereby pulling down the pull-down node P[N] and the transmission node R[N] to the low level. Also due to the bootstrap function of the capacitor C, the level of the pull-up node Q[N] is pulled down to Vd. The reset signal input terminal Reset[N] inputs a gate driving signal outputted by the next stage of gate driving unit, so as to turn on the eighth transistor T8, thereby pulling down the gate driving signal output terminal to the low level.

In the discharging phase t4, the fourth clock signal input terminal CLK4 inputs the effective level Vc, so as to turn on the second transistor T2. The capacitor C is discharged through the second transistor T2, thereby pulling down the pull-up node Q[N] to the low level.

From the above description it can be seen that in the gate driving circuit provided by this disclosure, on the basis of the effective level Vc of the clock signal, an extra DC level Vd is added to drive the gate scanning signal, so as to enable the effective level Vc of the clock signal to be at a lower voltage level while ensuring normal operation of the pixels of the display device. Hence, compared to the existing gate driving circuit, the power consumption of the gate driving circuit provided by this disclosure can be reduced.

In some embodiments, the pull-up node, the pull-down node and the transmission node of the Nth stage of gate driving unit are maintained at the second level through the pull-down sub-circuit of the Nth stage of gate driving unit under the control of the third clock signal and the fourth clock signal when the gate driving units except for the Nth stage of gate driving unit are driven. Thus it can be ensured that the level of each important node (i.e., the pull-up node, the pull-down node and the transmission node) of the Nth stage of gate driving unit is maintained at the second and invalid level during the period of time of non-Nth stage of gate driving unit, thereby achieving anti-noise effect.

As shown in FIG. 6, effective level time of each of the first clock signal, the second clock signal, the third clock signal and the fourth clock signal is ¼ cycle. That is, the first clock signal, the second clock signal, the third clock signal and the fourth clock signal have equal effective level time, which constitute a complete clock cycle of the gate driving circuit together.

The first clock signal, the second clock signal, the third clock signal and the fourth clock signal can use forward driving mode or reverse driving mode. In the forward driving mode, the first clock signal, the second clock signal, the third clock signal and the fourth clock signal are set at the effective level in sequence, and are delayed by ¼ cycle in sequence respectively. In the reverse driving mode, the fourth clock signal, the third clock signal, the second clock signal and the first clock signal are set at the effective level in sequence, and are delayed by ¼ cycle in sequence respectively. The fourth clock signal in the reverse driving mode is ¼ cycle ahead of the first clock signal in the forward driving mode.

In such an embodiment, the forward or backward scanning of the gate scanning signal can be controlled only by changing the input signal timing without changing the physical structure of the gate driving unit.

An embodiment of this disclosure further provides a display device, comprising the gate driving circuit stated in any of the above. The display device can be any product or component with a display function such as a mobile phone, a panel computer, a television, a display, a notebook computer, a digital photo frame, a navigator etc.

It should be pointed out that although the driving method of the gate driving circuit in FIG. 6 is divided into four phases, this is only for simple and convenient description. Moreover, although the driving method of the gate driving circuit has been described in certain sequence, the driving method is not limited to the described sequence. In fact, the driving process in FIG. 6 can be divided into several phases as appropriate, and different phases can be staggered or merged in time without departing from the spirit and the scope of this disclosure.

Although several embodiments have been described in detail above, other modifications are also possible. For example, the driving method described above does not require the particular sequence or order described to achieve the desired result. Other steps can be provided, or steps can be removed from the described flow. Moreover, other component can be added into or removed from the described system. Other embodiments can be within the scope of this disclosure. The skilled person in the art, in view of the teaching of this disclosure, can achieve numerous variants and modifications without departing from the spirit and the scope of this disclosure.

The invention claimed is:

1. A gate driving unit, comprising an input sub-circuit, a pull-up sub-circuit, a transmission sub-circuit, an output sub-circuit, a reset sub-circuit, a pull-down sub-circuit and a storage sub-circuit, an input signal input terminal, a first clock signal input terminal, a second clock signal input terminal, a third clock signal input terminal, a fourth clock signal input terminal, a reset signal input terminal, a first level input terminal, a second level input terminal and a gate driving signal output terminal, wherein the input sub-circuit is coupled to the input signal input terminal, the first clock signal input terminal and a pull-up node, and is configured to input an input signal to the pull-up node under control of a first clock signal;

the pull-up sub-circuit is coupled to the second clock signal input terminal, the pull-up node and a pull-down node, and is configured to pull up the pull-down node to a third level and pull up a level of the pull-up node through the storage sub-circuit;

the transmission sub-circuit is coupled to the second clock signal input terminal, the pull-up node and a transmission node, and is configured to transmit the level of the pull-up node to the transmission node under control of a second clock signal;

the output sub-circuit is coupled to the transmission node, the first level input terminal and the gate driving signal output terminal, and is configured to output a gate driving signal;

the reset sub-circuit is coupled to the reset signal input terminal, the first clock signal input terminal, the gate driving signal output terminal and the second level input terminal, and is configured to reset the gate driving signal output terminal under control of a reset signal;

the pull-down sub-circuit is coupled to the pull-up node, the pull-down node, the transmission node, the second level input terminal, the third clock signal input terminal and the fourth clock signal input terminal, and is configured to pull down the pull-up node, the pull-down node and the transmission node to a second level under control of a third clock signal and a fourth clock signal;

the storage sub-circuit is coupled to the pull-up node and the pull-down node, and is configured to store the input signal, wherein the third level is an effective level of the first clock signal, the second clock signal, the third clock signal and the fourth clock signal, and an absolute value of the third level is less than an absolute value of the first level.

2. The gate driving unit according to claim 1, wherein the pull-down sub-circuit comprises a first pull-down sub sub-circuit unit, a second pull-down sub sub-circuit unit and a third pull-down sub sub-circuit unit, wherein the first pull-down sub sub-circuit unit is coupled to the pull-up node, the second level input terminal and the fourth clock signal input terminal, and is configured to pull down the pull-up node to the second level under control of the fourth clock signal;

the second pull-down sub sub-circuit unit is coupled to the third clock signal input terminal, the second level input terminal and the pull-down node, and is configured to pull down the pull-down node to the second level under control of the third clock signal; and the third pull-down sub-circuit unit is coupled to the third clock signal input terminal, the transmission node and the second level input terminal, and is configured to pull down the transmission node to the second level under control of the third clock signal.

3. The gate driving unit according to claim 1, wherein the pull-down sub-circuit comprises a first pull-down sub-circuit unit and a second pull-down sub-circuit unit, wherein the first pull-down sub-circuit unit is coupled to the pull-up node, the second level input terminal and the fourth clock signal input terminal, and is configured to pull down the pull-up node to the second level under control of the fourth clock signal; the second pull-down sub-circuit unit is coupled to the third clock signal input terminal, the second level input terminal, the pull-down node and the transmission node, and is configured to pull down the pull-down node and the transmission node to the second level under control of the third clock signal.

4. The gate driving unit according to claim 1, wherein the input sub-circuit comprises a first transistor, a control terminal of the first transistor is coupled to the first clock signal input terminal, a first terminal of the first transistor is coupled to the input signal input terminal, and a second terminal of the first transistor is coupled to the pull-up node.

5. The gate driving unit according to claim 2, wherein the first pull-down sub-circuit unit comprises a second transistor, a control terminal of the second transistor is coupled to the fourth clock signal input terminal, a first terminal of the second transistor is coupled to the second level input terminal, and a second terminal of the second transistor is coupled to the pull-up node.

6. The gate driving unit according to claim 5, wherein the second pull-down sub-circuit unit comprises a third transistor, a control terminal of the third transistor is coupled to the third clock signal input terminal, a first terminal of the third transistor is coupled to the second level input terminal, and a second terminal of the third transistor is coupled to the pull-down node.

7. The gate driving unit according to claim 6, wherein the third pull-down sub-circuit unit comprises a fourth transistor, a control terminal of the four transistor is coupled to the third clock signal input terminal, a first terminal of the four transistor is coupled to the second level input terminal, and a second terminal of the four transistor is coupled to the transmission node.

8. The gate driving unit according to claim 7, wherein the pull-up sub-circuit comprises a fifth transistor, a control terminal of the fifth transistor is coupled to the pull-up node, a first terminal of the fifth transistor is coupled to the second clock signal input terminal, and a second terminal of the fifth transistor is coupled to the pull-down node.

9. The gate driving unit according to claim 8, wherein the transmission sub-circuit comprises a sixth transistor, a control terminal of the sixth transistor is coupled to the second clock signal input terminal, a first terminal of the sixth transistor is coupled to the pull-up node, and a second terminal of the sixth transistor is coupled to the transmission node.

10. The gate driving unit according to claim 9, wherein the output sub-circuit comprises a seventh transistor, a control terminal of the seventh transistor is coupled to the transmission node, a first terminal of the seventh transistor is coupled to the first level input terminal, and a second terminal of the seventh transistor is coupled to the gate driving signal output terminal.

11. The gate driving unit according to claim 10, wherein the reset sub-circuit comprises an eighth transistor and a ninth transistor, a control terminal of the eighth transistor is coupled to the reset signal input terminal, a first terminal of the eighth transistor is coupled to the second level input terminal, and a second terminal of the eighth transistor is coupled to the gate driving signal output terminal; a control terminal of the ninth transistor is coupled to the first clock signal input terminal, a first terminal of the ninth transistor is coupled to the second level input terminal, and a second terminal of the ninth transistor is coupled to the gate driving signal output terminal.

12. The gate driving unit according to claim 1, wherein the storage sub-circuit comprises a capacitor, a first plate of the capacitor is coupled to the pull-up node, and a second plate of the capacitor is coupled to the pull-down node.

13. The gate driving unit according to claim 11, wherein the first to the ninth transistors are N-type transistors, the first terminal is a drain, the second terminal is a source, the first level input terminal is a high level input terminal, and the second level input terminal is a low level input terminal.

14. A gate driving circuit, comprising a plurality of cascaded gate driving units according to claim 1, as well as a signal input terminal and a signal reset terminal, wherein except for a first stage and a last stage of gate driving units, a gate driving signal output terminal of each stage of gate driving unit is coupled to a reset signal input terminal of a previous stage of gate driving unit and an input signal input terminal of a next stage of gate driving unit, the input signal input terminal of the first stage of gate driving unit is coupled to the signal input terminal of the gate driving circuit, and the reset signal input terminal of the last stage of gate driving unit is coupled to the signal reset terminal of the gate driving circuit.

15. The gate driving circuit according to claim 14, wherein the gate driving circuit is coupled with a first clock signal line, a second clock signal line, a third clock signal line and a fourth clock signal line, wherein a first clock signal input terminal of the 4n-th stage of gate driving unit is coupled to the first clock signal line, a second clock signal input terminal of the 4n-th stage of gate driving unit is coupled to the second clock signal line, a third clock signal input terminal of the 4n-th stage of gate driving unit is coupled to the third clock signal line, and a fourth clock signal input terminal of the 4n-th stage of gate driving unit is coupled to the fourth clock signal line, a first clock signal input terminal of the 4n+1-th stage of gate driving unit is coupled to the second clock signal line, a second clock signal input terminal of the 4n+1-th stage of gate driving unit is coupled to the third clock signal line, a third clock signal input terminal of the 4n+1-th stage of gate driving unit is coupled to the fourth clock signal line, and a fourth clock signal input terminal of the 4n+1 th stage of gate driving unit is coupled to the first clock signal line, a first clock signal input terminal of the 4n+2-th stage of gate driving unit is coupled to the third clock signal line, a second clock signal input terminal of the 4n+2-th stage of gate driving unit is coupled to the fourth clock signal line, a third clock signal input terminal of the 4n+2-th stage of gate driving unit is coupled to the first clock signal line, and a fourth clock signal input terminal of the 4n+2-th stage of gate driving unit is coupled to the second clock signal line, a first clock signal input terminal of the 4n+3-th stage of gate driving unit is coupled to the fourth clock signal line, a second clock signal input terminal of the 4n+3-th stage of gate driving unit is coupled to the first clock signal line, a third clock signal input terminal of the 4n+3-th stage of gate driving unit is coupled to the second clock signal line, and a fourth clock signal input terminal of the 4n+3-th stage of gate driving unit is coupled to the third clock signal line, wherein n is an integer no smaller than 0.

16. A display device, comprising the gate driving circuit according to claim 14.

17. A method of driving a gate driving circuit, the gate driving circuit including a plurality of cascaded gate driving units, as well as a signal input terminal and a signal reset terminal, each gate driving unit including an input sub-circuit, a pull-up sub-circuit, a transmission sub-circuit, an output sub-circuit, a reset sub-circuit, a pull-down sub-circuit and a storage sub-circuit, an input signal input terminal, a first clock signal input terminal, a second clock signal input terminal, a third clock signal input terminal, a fourth clock signal input terminal, a reset signal input terminal, a first level input terminal, a second level input terminal and a gate driving signal output terminal, wherein the input sub-circuit is coupled to the input signal input terminal, the first clock signal input terminal and a pull-up node, and is configured to input an input signal to the pull-up node under control of a first clock signal; the pull-up sub-circuit is coupled to the second clock signal input terminal, the pull-up node and a pull-down node, and is configured to pull up the pull-down node to a third level and pull up a level of the pull-up node through the storage sub-circuit; the transmission sub-circuit is coupled to the second clock signal input terminal, the pull-up node and a transmission node, and is configured to transmit the level of the pull-up node to the transmission node under control of a second clock signal; the output sub-circuit is coupled to the transmission node, the first level input terminal and the gate driving signal output terminal, and is configured to output a gate driving signal; the reset sub-circuit is coupled to the reset signal input terminal, the first clock signal input terminal, the gate driving signal output terminal and the second level input terminal, and is configured to reset the gate driving signal output terminal under control of a reset signal; the pull-down sub-circuit is coupled to the pull-up node, the pull-down node, the transmission node, the second level input terminal, the third clock signal input terminal and the fourth clock signal input terminal, and is configured to pull down the pull-up node, the pull-down node and the transmission node to a second level under control of a third clock signal and a fourth clock signal; the storage sub-circuit is coupled to the pull-up node and the pull-down node, and is configured to store the input signal, the third level is an effective level of the first clock signal, the second clock signal, the third clock signal and the fourth clock signal, and an absolute value of the third level is less than an absolute value of the first level, except for a first stage and a last stage of gate driving units, a gate driving signal output terminal of each stage of gate driving unit is coupled to a reset signal input terminal of a previous stage of gate driving unit and an input signal input terminal of a next stage of gate driving unit, the input signal input terminal of the first stage of gate driving unit is coupled to the signal input terminal of the gate driving circuit, and the reset signal input terminal of the last stage of gate driving unit is coupled to the signal reset terminal of the gate driving circuit, wherein a process of driving the Nth stage of gate driving unit comprises:

an input charging phase, an output phase, a reset phase and a discharging phase, wherein in the input charging phase, under control of the first clock signal, the input sub-circuit pulls up a pull-up node to a first level, and the storage sub-circuit is charged so as to store the first level of the pull-up node;

in the output phase, under control of the second clock signal, the pull-up sub-circuit further pulls up a first node, and the transmission sub-circuit transmits the level of the pull-up node to a transmission node, and under control of the level, the output sub-circuit outputs a Nth stage of gate driving signal;

in the reset phase, the pull-down sub-circuit pulls down the pull-down node and the transmission node to a second level under control of the third clock signal, pulls down the pull-up node to the first level, and the reset sub-circuit resets the gate driving signal output terminal under control of the reset signal; and in the discharging phase, under control of the fourth clock signal, the storage sub-circuit discharges, and the pull-down sub-circuit pulls down the pull-up node to the second level, wherein N is an integer no smaller than 1.

18. The method according to claim 17, wherein the pull-up node, the pull-down node and the transmission node of the Nth stage of gate driving unit are maintained at the second level through the pull-down sub-circuit of the Nth stage of gate driving unit under the control of the third clock signal and the fourth clock signal when the gate driving units except for the Nth stage of gate driving unit are driven.

19. The method according to claim 17, wherein effective level time of each of the first clock signal, the second clock signal, the third clock signal and the fourth clock signal is ¼ cycle.

20. The method according to claim 19, wherein the first clock signal, the second clock signal, the third clock signal and the fourth clock signal use forward driving mode or reverse driving mode, wherein in the forward driving mode, the first clock signal, the second clock signal, the third clock signal and the fourth clock signal are set at the effective level in sequence, and are delayed by ¼ cycle in sequence respectively;

in the reverse driving mode, the fourth clock signal, the third clock signal, the second clock signal and the first clock signal are set at the effective level in sequence, and are delayed by ¼ cycle in sequence respectively;

wherein the fourth clock signal in the reverse driving mode is ¼ cycle ahead of the first clock signal in the forward driving mode.

* * * * *